(12) United States Patent
Saita et al.

(10) Patent No.: US 8,149,584 B2
(45) Date of Patent: Apr. 3, 2012

(54) ELECTRONIC COMPONENT AND ELECTRONIC COMPONENT MODULE

(75) Inventors: Hitoshi Saita, Tokyo (JP); Kenji Horino, Tokyo (JP); Yasunobu Oikawa, Tokyo (JP); Shinichiro Kakei, Tokyo (JP)

(73) Assignee: TDK Corporation, Tokyo (JP)

( * ) Notice: Subject to any disclaimer, the term of this patent is extended or adjusted under 35 U.S.C. 154(b) by 344 days.

(21) Appl. No.: 12/410,685

(22) Filed: Mar. 25, 2009

(65) Prior Publication Data

US 2009/0242256 A1 Oct. 1, 2009

(30) Foreign Application Priority Data

Mar. 31, 2008 (JP) ................ P2008-090335

(51) Int. Cl.
*H05K 1/18* (2006.01)
(52) U.S. Cl. ........ 361/761; 361/728; 361/766; 174/261; 174/255
(58) Field of Classification Search ........... 174/254, 174/255, 256, 260, 261; 361/728–731, 735, 361/748, 760, 761–764, 301, 795, 271, 738, 361/766, 820; 257/618, 730, 700, 773
See application file for complete search history.

(56) References Cited

U.S. PATENT DOCUMENTS

| | | | | |
|---|---|---|---|---|
| 5,311,059 A * | 5/1994 | Banerji et al. | | 257/778 |
| 6,049,124 A * | 4/2000 | Raiser et al. | | 257/712 |
| 6,354,485 B1 * | 3/2002 | Distefano | | 228/179.1 |
| 6,787,884 B2 | 9/2004 | Hirano et al. | | |
| 7,102,227 B2 | 9/2006 | Terui | | |
| 7,140,104 B2 | 11/2006 | Hirano et al. | | |
| 2002/0089054 A1 * | 7/2002 | Fukasawa et al. | | 257/697 |
| 2003/0057544 A1 * | 3/2003 | Nathan et al. | | 257/700 |
| 2003/0090883 A1 * | 5/2003 | Asahi et al. | | 361/761 |
| 2003/0222335 A1 * | 12/2003 | Hirano et al. | | 257/678 |
| 2006/0246674 A1 | 11/2006 | Terui | | |
| 2007/0045814 A1 * | 3/2007 | Yamamoto et al. | | 257/698 |
| 2008/0236877 A1 * | 10/2008 | Amey et al. | | 174/260 |

FOREIGN PATENT DOCUMENTS

| | | |
|---|---|---|
| JP | A-2-205005 | 8/1990 |
| JP | A-4-164304 | 6/1992 |
| JP | A-2004-56112 | 2/2004 |
| JP | A-2005-136360 | 5/2005 |
| JP | A-2007-35975 | 2/2007 |
| JP | A-2007-188957 | 7/2007 |
| JP | A-2007-242851 | 9/2007 |

OTHER PUBLICATIONS

Translation of Apr. 13, 2010 Office Action issued in Japanese Patent Application No. P2008-090335.

* cited by examiner

*Primary Examiner* — Hoa C Nguyen
(74) *Attorney, Agent, or Firm* — Oliff & Berridge, PLC

(57) ABSTRACT

In a dielectric element, the angle θ made by either the top face or the bottom face and the side faces is either 0°<θ<89°, or is 91°<θ<180°, and is an angle other than 89°≦θ≦91°. By this means, the area of contact of the side faces of the dielectric element with a glass epoxy resin substrate and with insulating material is increased, adhesion with the resin substrates is improved, and strength and reliability can be enhanced when buried between the two resin substrates.

4 Claims, 5 Drawing Sheets

Fig.5

| TAPER ANGLE OF SAMPLE SIDE FACES (°) | TAPER FABRICATION METHOD | RESULT OF RELIABILITY TEST |
|---|---|---|
| 40 | NORMAL DICING (TAPER-LESS BLADE) +ETCHING WITH FeCl₃ SOLUTION, 20 MIN | GOOD |
| 60 | NORMAL DICING (TAPER-LESS BLADE) +ETCHING WITH FeCl₃ SOLUTION, 13 MIN | VERY GOOD |
| 75 | NORMAL DICING (TAPER-LESS BLADE) +ETCHING WITH FeCl₃ SOLUTION, 11 MIN | VERY GOOD |
| 80 | NORMAL DICING (TAPER-LESS BLADE) +ETCHING WITH FeCl₃ SOLUTION, 10 MIN | VERY GOOD |
| 100 | DICING ONLY (BLADE WITH 10° TAPER) | VERY GOOD |
| 105 | DICING ONLY (BLADE WITH 15° TAPER) | VERY GOOD |
| 120 | DICING ONLY (BLADE WITH 30° TAPER) | VERY GOOD |
| 140 | DICING ONLY (BLADE WITH 50° TAPER) | GOOD |
| 87 | NORMAL DICING (TAPER-LESS BLADE) + ETCHING WITH FeCl₃ SOLUTION, 2 MIN | GOOD |
| 89 | NORMAL DICING (TAPER-LESS BLADE) + ETCHING WITH FeCl₃ SOLUTION, 30 S | SEPARATION OCCURRED |
| 91 | DICING ONLY (BLADE WITH 1° TAPER) | SEPARATION OCCURRED |
| 90 | DICING ONLY (TAPER-LESS BLADE) | SEPARATION OCCURRED |

N=100

ELECTRONIC COMPONENT AND ELECTRONIC COMPONENT MODULE

BACKGROUND OF THE INVENTION

1. Field of the Invention

This invention relates to an electronic component and to an electronic component module, and in particular relates to an electronic component which is buried so as to be sandwiched between two resin substrates, and to an electronic component module in which the electronic component is buried so as to be sandwiched between two resin substrates.

2. Related Background Art

In order to accommodate the reduction in size and thickness and the higher mounting densities of wiring substrates package substrates) in recent years, it has been proposed that in addition to IC components, capacitors, resistors, and other chip components be incorporated within substrates. Possible advantages of burying chip components and other electronic components in substrates include increased substrate mounting area, and the ability to manufacture electronic component modules and other electronic circuit substrates with high added value while remaining the same thickness and size. And, by burying capacitors and similar, the wiring length to other active elements can be shortened, so that the occurrence of unwanted electromagnetic radiation can be suppressed, and declines in signal and power transmission velocity can be suppressed, so that high-performance electronic circuit substrates can be manufactured.

For example, in Japanese Patent Application Laid-open No. 2007-242851, a multilayer substrate with incorporated components is disclosed which is a multilayer substrate with incorporated components in which a stacked member, in which multiple layers of circuit substrates having circuits formed on substrate insulating material are stacked, incorporates at least one type of active components such as semiconductor ICs; by making the substrate insulating material, on which circuits are formed connecting the components, a polyimide film the average linear expansion coefficient (CTE) in the range 100° C. to 350° C. of which is in the range −5 (ppm/° C.) to +20 (ppm/° C.), warping due to stacking of different materials, and separation of components and circuits, are prevented.

However, electronic components buried in a substrate as described above must be of low height, or formed on extremely thin foil, in order to enable burial in the substrate. For this reason the areas of the side-face adhesion portions of capacitors and other electronic components are small, and there is the problem of adhesion of the side faces of electronic components with the substrate. Further, when burying electronic components in resin or similar, a gap may be formed between a side face of an electronic component and the resin. When for example solder reflow or similar is used to mount ICs on the substrate, because the substrate is subjected to thermal cycles, so that the substrate expands and contracts, abnormal stresses may be concentrated at such gaps, giving rise to problems of strength and reliability.

SUMMARY OF THE INVENTION

This invention was devised in light of the above circumstances, and provides an electronic component and an electronic component module which improve adhesion with a substrate and enhance strength and reliability upon burial between two resin substrates.

An electronic component of this invention is buried so as to be sandwiched between a first resin substrate and a second resin substrate, comprises a mounting face which faces the first resin substrate, an opposing face which opposes the mounting face and faces the second resin substrate, and at least one pair of side faces which intersect with the mounting face and the opposing face, and is characterized in that the angle θ made by either the mounting face or the opposing face and at least a portion of the side faces is either 0<θ<89°, or is 91°<θ<180°.

According to this configuration, the angle θ made by either the mounting face or the opposing face with at least a portion of the side faces is either 0°<θ<89° or 91°<θ<180°, and is an angle other than 89≦θ≦91°, so that the contact area of the side faces of the electronic component with the first and second resin substrates is increased, adhesion to the resin substrates is improved, and the strength and reliability are enhanced upon burial between the two resin substrates.

In this case, it is preferable that the angle θ made by either the mounting face or the opposing face and at least a portion of the side faces be either 60°≦θ≦85° or 95≦θ≦120°.

According to this configuration, the contact area of the side faces of the electronic component with the first and second resin substrates is further increased, and adhesion of the side faces of the electronic component to the resin substrates can be further improved.

Further, the electronic component may have a supporting substrate, and the supporting substrate may be a metal foil of Cu, Ni, Al, or a metal foil comprising one or more of these metals, or may comprise a structure having a metal electrode layer of Cu, Ni, Al, or a noble metal, or a metal electrode layer comprising one or more of these metals, on a Si or ceramic substrate.

This configuration enables enhancement of the adhesion between side faces of the electronic component and the resin substrates, and so is particularly advantageous when the supporting substrate is a metal foil of Cu, Ni, or Al, or a metal foil comprising one or more of these metals, or when the supporting substrate comprises a structure having a metal electrode layer of Cu, Ni, Al, or a noble metal, or a metal electrode layer comprising one or more of these metals on a Si or ceramic substrate, insofar as the difference in thermal expansion coefficients of such metals with resin is large.

Further, it is preferable that the thickness between the mounting face and the opposing face be between 1 μm and 1000 μm.

According to this configuration, the electronic component is thin, with a thickness of 1 μm to 1000 μm, so that an electronic component module in which electronic component of an embodiment of this invention is buried can be designed to have a low height and high integration density.

Further, an electronic component module of an embodiment of this invention comprises the electronic component, buried so as to be sandwiched between a first resin substrate and a second resin substrate.

According to the electronic component and electronic component module, adhesion with substrates can be improved, and upon burial between two resin substrates, strength and reliability can be enhanced.

BRIEF DESCRIPTION OF THE DRAWINGS

FIG. 5 is a table showing taper angles of dielectric elements of experimental examples and reliability testing results.

DESCRIPTION OF THE PREFERRED EMBODIMENTS

Below, electronic components and electronic component modules of aspects of the invention are explained, referring to the attached drawings.

Figure 1:
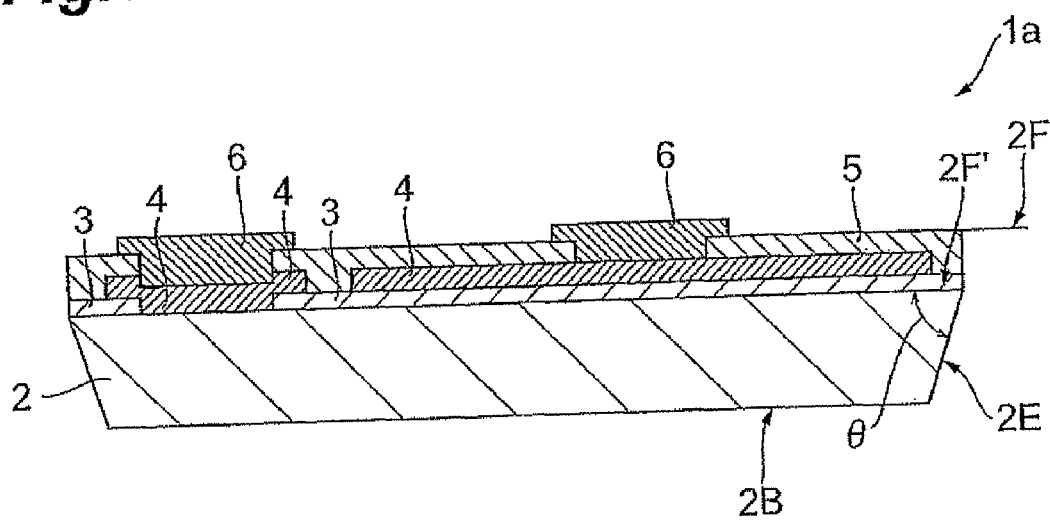
FIG. 1 is a summary cross-sectional view showing the structure of the dielectric element of an aspect.

Below, embodiments of electronic components of this invention, configured as dielectric elements, are explained. FIG. 1 is a summary cross-sectional view showing the structure of the dielectric element 1a of an aspect. The dielectric element 1a shown in FIG. 1 is configured as a thin film capacitor, buried so as to be sandwiched between a glass epoxy resin substrate (first resin substrate) and insulating material (second resin substrate), described below, and overall has a thin film shape with four edges.

As shown in FIG. 1, the dielectric element 1a has Ni foil 2 as a lower metal layer; a dielectric film 3 provided on the surface 2F' of the Ni foil 2; a Cu electrode 4 provided on the upper face of the dielectric film 3; and another Cu electrode 4 provided directly on the surface 2F' of the Ni foil 2 penetrating the dielectric film 3. On the upper face of the Cu electrode 4 is provided a polyimide film 5. In order to extract the Cu electrode 4 from the polyimide layer 5, a Cu lead electrode 6 penetrating the polyimide layer 5 is provided on a portion of the upper face of the Cu electrode 4.

The Ni foil 2 may be a base metal foil which is inexpensive and has low resistance; for example, metal foil of Cu or Al, or metal foil comprising at least one metal among Ni, Cu and Al, may be used. Further, a structure may be employed having a metal electrode layer of Cu, Ni, Al, or a noble metal, or a metal electrode layer comprising at least one of these types of metals, on a Si or ceramic substrate. Further, the dielectric film 3 can be formed from material comprising one or more types among Bi, Ba, Sr, Ca, Ti, Zr, Hf, Ta, and Nb, and can for example be formed from $BaTiO_3$.

As shown in FIG. 1, the dielectric element 1a overall has a top face (mounting face) 2F facing the glass epoxy resin substrate, and bottom top face (opposing face) 2B facing the insulating material. The thickness between the bottom face and the top face is 1 μm to 1000 μm, and more preferably is 1 μm to 500 μm. The dielectric element 1a comprises two pairs of side faces 2E which intersect the bottom face 2B and top face 2F. In the example of FIG. 1, the angle θ made by the top face 2F' of the Ni foil 2 of the dielectric element 1a and the side faces 2E is $0°<θ<89°$, and more preferably is $60°\leq θ\leq 85°$.

Figure 2:
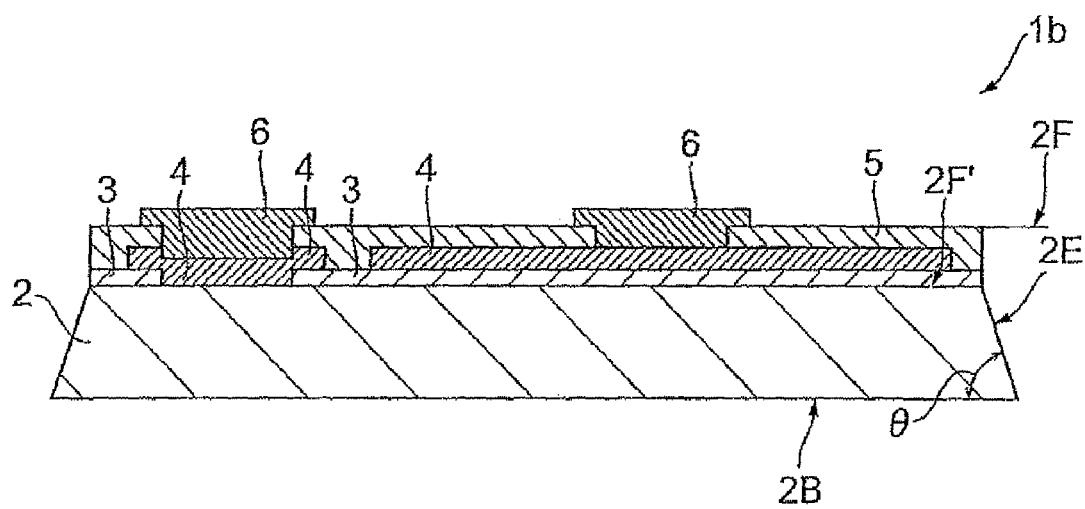
FIG. 2 is a summary cross-sectional view showing another structure of the dielectric element of an aspect.

FIG. 2 shows another structure of the dielectric element of an aspect. In the example shown in FIG. 2, the bottom face (mounting face) 2B faces the glass epoxy resin substrate (first resin substrate), and the top face (opposing face) 2F faces the insulating material (second resin substrate). As shown in the FIG. 2, the angle θ made by the bottom face 2B of the dielectric element 1b and the side faces 2E is $91°<θ<180°$, and more preferably is $95°\leq θ\leq 120°$.

Figure 3:
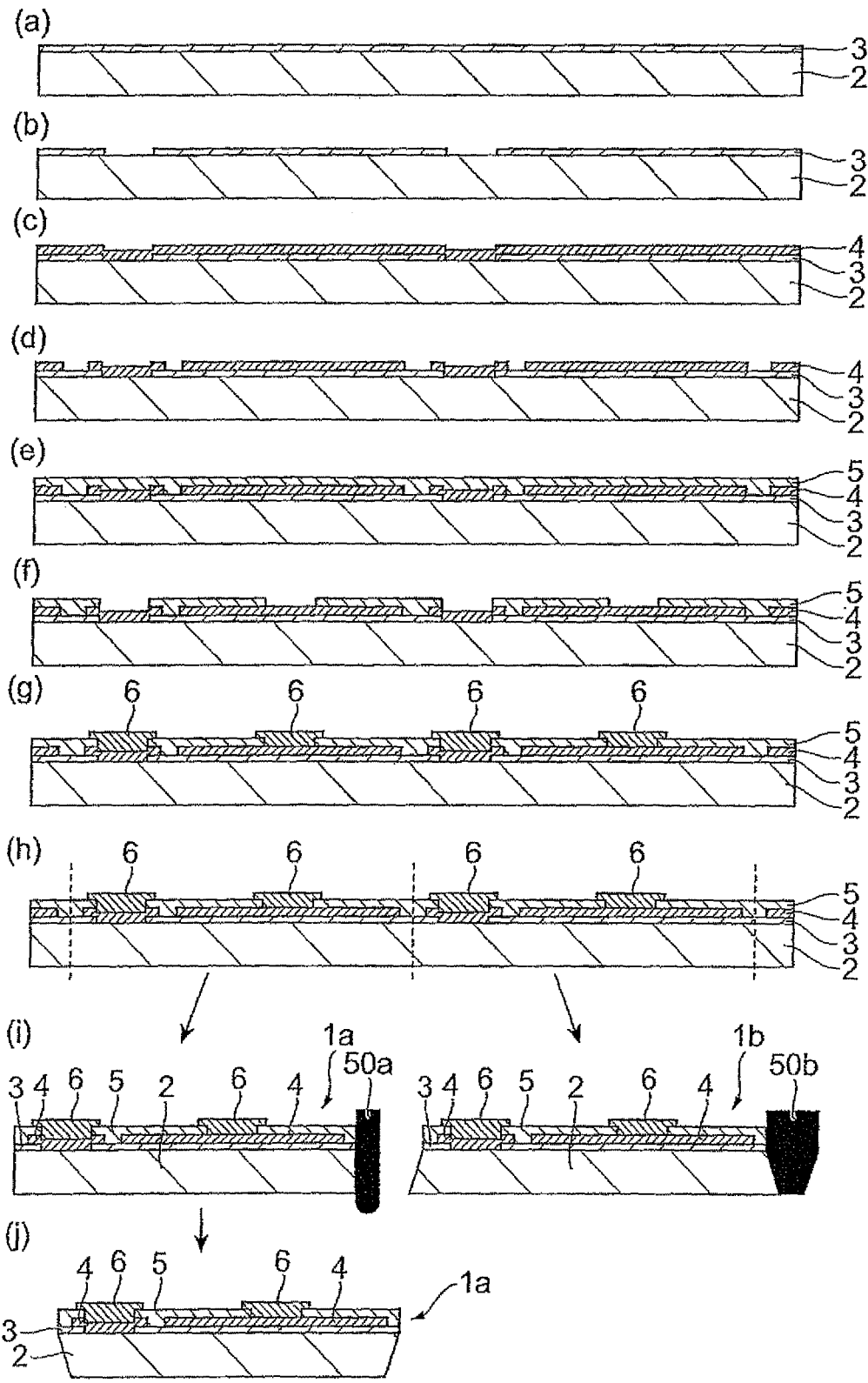
FIG. 3 is a process diagram showing a method of manufacture of the dielectric element of an aspect.

Below, a method of manufacture of the dielectric elements 1a and 1b is explained. (a) to (j) in FIG. 3 are process diagrams showing a method of manufacture of dielectric elements of an aspect. Below, as the method of formation of the dielectric film 3, a method of manufacture using a chemical solution deposition method is explained. In the chemical solution decomposition method, a MOD starting material solution is used as the starting material. MOD is an abbreviation of "metal-organic decomposition"; a thin film is formed by a method of thermal decomposition of an applied material. As the MOD starting material solution, in general a solution obtained by dissolving a metalorganic salt using an alcohol or another solvent is employed. For example, as the MOD starting material solution, barium octylate, strontium octylate, and titanium octylate are dissolved using a butanol solvent, to obtain a perovskite structure $Ba_{0.7}Sr_{0.3}TiO_3$ film with a dielectric composition.

The above-described MOD starting material solution is adjusted to a concentration of for example 0.1 mol/kg, and is applied onto a 100 mm×100 mm Ni substrate prepared in advance. As the method of application, spin coating, die coating, slit coating, printing, spray coating, or other application methods can be used.

After application of the MOD starting material solution, the applied film is thermally decomposed at, for example, 400° C. in air for 10 minutes. This process is called calcining. And, the resulting film is called a calcined film. This calcined film is normally in an amorphous state, is not crystallized, and is a film with an extremely low dielectric constant. In order to crystallize this calcined film, annealing is performed at, for example, 800° C. for 30 minutes in vacuum, to cause crystallization.

The above application and calcining are repeated a plurality of times, and finally, crystallization by annealing is performed once, to obtain a dielectric film 3 with the target thickness of, for example, 200 nm, as shown in (a) of FIG. 3.

As shown in (b) of FIG. 3, the surface of the dielectric film 3 is patterned. Patterning can for example be performed by wet etching, using a nitric acid-hydrogen peroxide solution. As shown in (c) of FIG. 3, as the Cu electrode 4, a Cu layer is deposited by sputtering to a thickness of for example 1 μm. As shown in (d) of FIG. 3, the Cu layer thus formed is patterned. An ammonium persulfate aqueous solution can be used for this patterning.

After forming the polyimide layer 5 as shown in (e) of FIG. 3, through-holes are formed in the polyimide layer 5 as shown in (f) of FIG. 3. Cu extraction electrodes 6 are formed as shown in (g) of FIG. 3. Then, by dicing and separating the capacitors as shown in (h) of FIG. 3, capacitors each of which is of size 1005 (1 mm×0.5 mm) are obtained.

As shown in (i) and (j) of FIG. 3, after dicing using a normal dicing blade 50a not provided with a taper angle, the cut edges alone can be etched to form the angle θ of the side faces 2E of the dielectric element 1a of FIG. 1. Only the cut edges can be immersed in etchant by, for example, leaving dicing cover tape in place during and after dicing. As the etchant, for example an iron chloride solution can be used. Etching can for example be performed using a bubble etcher. The etching time can be changed to adjust the angle θ of the side faces 2E of the dielectric element 1a.

Or, the angle θ of the side faces 2E of the dielectric element 1b of FIG. 2 can be formed by performing dicing using a dicing blade 50b provided with a taper angle. The angle θ of the side faces 2E of the dielectric element 1b can be adjusted by changing the taper angle of the dicing blade 50b.

In cases in which the Ni foil 2 alone is too thin and strength is inadequate during mounting, by providing a resin film as backing on the bottom face 2B of the Ni foil 2 in a process between (g) and (h) in FIG. 3, the dielectric element 1a, 1b can be provided with the necessary strength. In this case, the dielectric elements 1a, 1b provided with the backing of for example a resin film or similar on the bottom face 2B of the Ni foil 2 are similarly diced and etched in (i) and (j) of FIG. 3 to form the angle θ, obtaining the advantageous results of this aspect.

Figure 4:
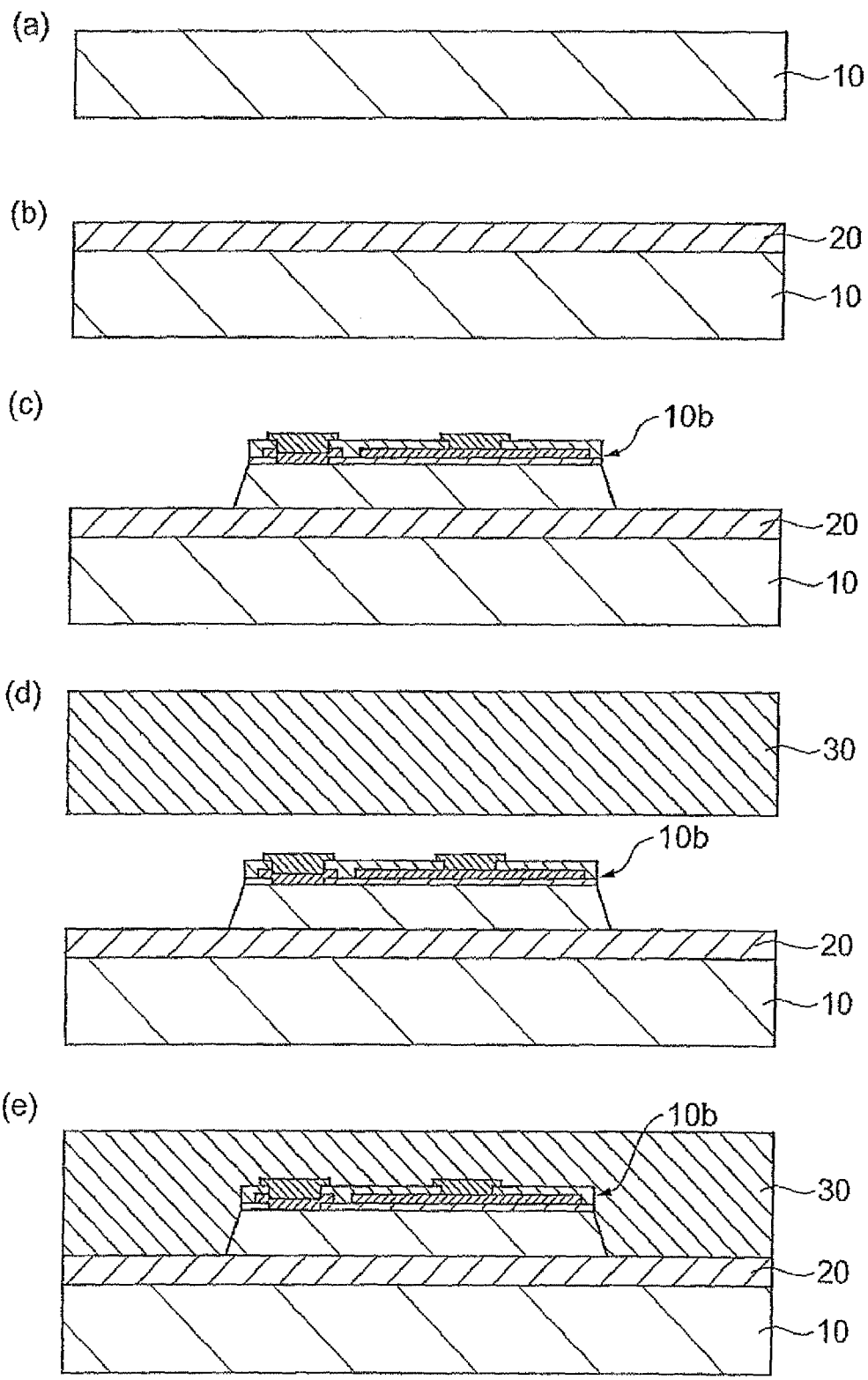
FIG. 4 is a process diagram showing a process of burying the dielectric element of an aspect in a substrate.

(a) to (e) of FIG. 4 are process diagrams showing processes to bury a dielectric element of an aspect in a substrate. As shown in (a) of FIG. 4, a glass epoxy resin substrate (first resin substrate) 10 is prepared, and as shown in (b) of FIG. 4, unhardened-state resin 20, of B stage (indoors, in a state of thermal hardening through heating in the unhardened solid state) epoxy resin or similar, is formed. As shown in (c) of FIG. 4, the dielectric element 1b is mounted such that the bottom face 2B faces the unhardened-state resin 20. As shown in (d) of FIG. 4, the dielectric element 1b is sandwiched between the glass epoxy resin substrate 10 and insulating material 30, such that the top face 2F faces the insulating material 30. As shown in (e) of FIG. 4, the unhardened-state resin 20 is heat-cured, the glass epoxy resin substrate 10 and the insulating material 30 are pressure-bonded by heat pressing, and the dielectric element 1b is buried.

When burying the dielectric element 1a shown in FIG. 1, in the process of (c) in FIG. 4 the dielectric element 1a is mounted such that the top face 2F faces the unhardened-state resin 20 of the glass epoxy resin substrate 10, and in the process of (d) of FIG. 4, the dielectric element 1a is sandwiched between the glass epoxy resin substrate 10 and the insulating material 30 such that the insulating material 30 faces the bottom face 2B.

According to these aspects, because the angle θ made by the either the top face 2F or the bottom face 2B and the side faces 2E is either $0° < \theta < 89°$ or $91° < \theta < 180°$, and is an angle other than $89° \leq \theta \leq 91°$, the area of contact between the side faces of the dielectric element 1a, 1b and the glass epoxy resin substrate 10 and insulating material 30 is increased, adhesion with the resin substrate is improved, and the strength and reliability upon burial between the two resin substrates can be enhanced.

In particular, according to these aspects, by making the angle θ made by either the top face 2F or the bottom face 2B and the side faces 2E either $60° \leq \theta \leq 85°$ or $95° \leq \theta \leq 120°$, the area of contact of the side faces of the dielectric element 1a, 1b with the glass epoxy resin substrate 10 and the insulating material 30 is further increased, so that adhesion of the side faces of the electronic component with the resin substrates can be further improved.

On the other hand, in this aspect the adhesion between the electronic component side faces and the resin substrates can be enhanced, so that especially great advantages accrue when the metal foil portions of the dielectric elements 1a, 1b are metal foil of Cu, Ni, Al, the difference in thermal expansion coefficients with the resin of which is large, or when the structure has metal foil comprising one or more types from among these metals, or when the structure has a metal electrode layer of Cu, Ni, Al, or a noble metal, or a metal electrode layer comprising one or more of these types of metals on a Si or ceramic substrate.

In addition, in this aspect the dielectric elements 1a, 1b are made thin, with thicknesses of 1 μm to 1000 μm, so that an electronic component module in which the dielectric elements 1a, 1b are buried can be designed to be of low height and with a high integration density.

Below, experimental examples of dielectric elements 1a, 1b of this aspect are explained. The dielectric elements 1a and 1b shown in FIG. 1 and FIG. 2 were manufactured by the method shown in FIG. 3. The conditions were as follows.

Sample metal foil: Ni foil, 100 mm×100 mm

MOD starting material solution: $Ba_{0.7}Sr_{0.3}TiO_3$, butanol solvent, concentration 0.1 mol/kg MOD starting material application method: Spin coating Calcining: Thermal decomposition in air at 400° C.

Calcined film crystallization: Annealing for 30 minutes in vacuum at 800° C.

Dielectric film thickness: 200 nm

Dielectric film patterning: Wet etching using nitric acid and hydrogen peroxide

Cu electrode formation: Cu layer formed by sputtering to 1 μm, then patterned using an ammonium persulfate aqueous solution Separated capacitor size: 1 mm×0.5 mm Electronic components, having an angle θ formed by the top face 2F and the side faces 2E of 0° to less than 90°, were fabricated by etching only of the side faces 2E after dicing using an etchant. In order to immerse only the side faces 2E in the etchant, dicing cover tape was left in place during and after dicing. As the etchant, iron chloride solution was used. A bubble etcher was used in etching, and samples of separated dielectric elements 1a, 1b were etched by immersion. The angle θ formed by the top face 2F and side faces 2E was measured using an optical microscope taking the face of the dielectric film 3 as reference, with the angle made by the surface of the dielectric film 3 and the side face 2 taken to be the angle θ made by the top face 2F and the side face 2E. Adjustment of the angle θ of the side face 2E was performed by changing the etching time. For comparison, dielectric elements were also fabricated having an angle θ made by the top face 2F and side faces 2E of $89° \leq \theta \leq 91°$.

Ten samples of dielectric elements fabricated as described above were buried so as to be sandwiched between a glass epoxy resin substrate 10 and insulating material 30 as shown in FIG. 4.

A hundred evaluation samples fabricated as described above were evaluated in heat cycle tests. As testing conditions, 1000 heating and cooling cycles between −65° C. and 125° C. were performed, and reliability was evaluated. After tests, the glass epoxy resin substrate 10 and insulating material 30 were cut so as to pass through an incorporated dielectric element, the cross-section was observed using a microscope, and inspections for element warping and separation were performed. Elements in which warping and separation were not observed were judged to be satisfactory, and separation was deemed to have occurred in other elements. Results appear in FIG. 5.

As shown in FIG. 5, elements for which the angle θ between the top face 2F and side faces 2E was $\theta \leq 87°$ were found to have almost no separation. In particular, elements for which the angle θ between the top face 2F and side faces 2E was $60° \leq \theta \leq 85°$ and $100° \leq \theta \leq 120°$ were found to have no separation at all, and of 100 samples, none were unsatisfactory. From this it is seen that, taking the symmetry of the taper angle into consideration, if the angle is such that $60° \leq \theta \leq 85°$ or $95° \leq \theta \leq 120°$, an element can be manufactured with no separation at all. For samples manufactured with angles at 140°, 40°, and 87°, separation occurred with a probability of three samples or less in 100; this is substantially the range in which the advantageous result of the taper could be confirmed. On the other hand, for samples the angle θ between the top face 2F and side faces 2E of which was $89° \leq \theta \leq 91°$, of 100 samples, separation was observed in half or more.

In the above, aspects of the invention were explained; however, this invention is not limited to the above aspects, and various modifications are possible.

What is claimed is:

1. An electronic component, buried so as to be sandwiched between a first resin substrate and a second resin substrate, comprising:

a supporting substrate, the supporting substrate including
a mounting face which faces the first resin substrate;

an opposing face which opposes the mounting face and faces the second resin substrate; and at least one pair of side faces, which intersect with the mounting face and the opposing face, the at least one pair of side faces being in contact with the second resin substrate;

a dielectric film provided on the opposing face of the supporting substrate; and an electrode provided on an upper face of the dielectric film, wherein an angle θ made between at least a portion of the side faces and the mounting face at a line of intersection of the mounting face and the portion of the side faces is 0°<θ<89°, and the supporting substrate is a metal foil of Cu, Ni, Al, or a metal foil comprising one or more of these metals, or comprises a structure having a metal electrode layer of Cu. Ni, Al or a noble metal, or a metal electrode layer comprising one or more of these metals, on a Si or ceramic substrate.

2. The electronic component according to claim 1, wherein the angle θ made between at least a portion of the side faces and the mounting face at the line of intersection of the mounting face and the portion of the side faces is 60°≦θ≦85°.

3. The electronic component according to claim 1, wherein the thickness between the mounting face and the opposing face is from 1 μm to 1000 μm.

4. An electronic component module, wherein the electronic component according to claim 1 is buried so as to be sandwiched between the first resin substrate and the second resin substrate.

* * * * *